(12) United States Patent
Nagaura et al.

(10) Patent No.: US 9,788,423 B2
(45) Date of Patent: Oct. 10, 2017

(54) COPPER FOIL WITH CARRIER

(71) Applicant: JX Nippon Mining & Metals Corporation, Tokyo (JP)

(72) Inventors: Tomota Nagaura, Ibaraki (JP); Michiya Kohiki, Ibaraki (JP); Terumasa Moriyama, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/139,482

(22) Filed: Apr. 27, 2016

(65) Prior Publication Data

US 2016/0242281 A1    Aug. 18, 2016

Related U.S. Application Data

(62) Division of application No. 14/388,381, filed as application No. PCT/JP2013/058653 on Mar. 26, 2013.

(30) Foreign Application Priority Data

Mar. 26, 2012    (JP) ................................ 2012-069660

(51) Int. Cl.
*H05K 1/09* (2006.01)
*B32B 15/01* (2006.01)
(Continued)

(52) U.S. Cl.
CPC ............... *H05K 1/09* (2013.01); *B32B 3/30* (2013.01); *B32B 15/01* (2013.01); *B32B 15/08* (2013.01);
(Continued)

(58) Field of Classification Search
None
See application file for complete search history.

(56) References Cited

U.S. PATENT DOCUMENTS 3,585,010 A    6/1971    Luce et al.
6,541,126 B1    4/2003    Yoshioka et al.
(Continued)

FOREIGN PATENT DOCUMENTS

EP    0 797 378 A2    9/1997
EP    1531656 A2    5/2005
(Continued)

OTHER PUBLICATIONS

Search Report in Application No. PCT/JP2013/058653 dated Apr. 23, 2013.
(Continued)

*Primary Examiner* — David Sample
(74) *Attorney, Agent, or Firm* — Marshall, Gerstein & Borun LLP (57) ABSTRACT

Provided is a copper foil for a printed wiring board including a roughened layer on at least one surface thereof. In the roughened layer, the average diameter D1 at the particle bottom being apart from the bottom of each particle by 10% of the particle length is 0.2 to 1.0 μm, and the ratio L1/D1 of the particle length L1 to the average diameter D1 at the particle bottom is 15 or less. In the copper foil for printed wiring board, when a copper foil for printed wiring having a roughened layer is laminated to a resin and then the copper layer is removed by etching, the sum of areas of holes accounting for the resin roughened surface having unevenness is 20% or more. The present invention involves the development of a copper foil for a semiconductor package substrate that can avoid circuit erosion without causing deterioration in other properties of the copper foil. In particular, an object of the present invention is to provide a copper foil for a printed wiring board and a method of producing the copper foil, in which the adhesion strength between the copper foil and the resin can be enhanced by improvement of the roughened layer of the copper foil.

1 Claim, 1 Drawing Sheet

(51) Int. Cl.
| | |
|---|---|
| B32B 3/30 | (2006.01) |
| C22C 9/00 | (2006.01) |
| H05K 3/38 | (2006.01) |
| H05K 1/03 | (2006.01) |
| H05K 3/06 | (2006.01) |
| H05K 3/18 | (2006.01) |
| B32B 15/08 | (2006.01) |
| B32B 15/20 | (2006.01) |
| C25D 1/04 | (2006.01) |
| C25D 5/12 | (2006.01) |
| H05K 3/02 | (2006.01) |
| C25D 3/12 | (2006.01) |
| C25D 3/38 | (2006.01) |
| C25D 9/08 | (2006.01) |

(52) U.S. Cl.
CPC ............... *B32B 15/20* (2013.01); *C22C 9/00* (2013.01); *C25D 1/04* (2013.01); *C25D 5/12* (2013.01); *H05K 1/0313* (2013.01); *H05K 3/025* (2013.01); *H05K 3/06* (2013.01); *H05K 3/181* (2013.01); *H05K 3/188* (2013.01); *H05K 3/381* (2013.01); *H05K 3/383* (2013.01); *H05K 3/388* (2013.01); *B32B 2307/306* (2013.01); *B32B 2307/714* (2013.01); *B32B 2457/08* (2013.01); *C25D 3/12* (2013.01); *C25D 3/38* (2013.01); *C25D 9/08* (2013.01); *H05K 3/022* (2013.01); *H05K 2201/09009* (2013.01); *Y10T 428/1291* (2015.01); *Y10T 428/12549* (2015.01); *Y10T 428/12569* (2015.01); *Y10T 428/12611* (2015.01); *Y10T 428/12792* (2015.01); *Y10T 428/12847* (2015.01); *Y10T 428/12903* (2015.01)

(56) References Cited

U.S. PATENT DOCUMENTS

| | | | |
|---|---|---|---|
| 7,026,059 | B2 | 4/2006 | Suzuki et al. |
| 7,381,475 | B2 | 6/2008 | Suzuki |
| 7,691,487 | B2 | 4/2010 | Nagatani |
| 2006/0088723 | A1 | 4/2006 | Suzuki |
| 2009/0291319 | A1* | 11/2009 | Nagatani ............... C23C 30/00 428/607 |
| 2011/0127074 | A1 | 6/2011 | Takahashi |
| 2011/0209903 | A1 | 9/2011 | Uno et al. |
| 2013/0189538 | A1* | 7/2013 | Moriyama ............... C25D 3/38 428/612 |

FOREIGN PATENT DOCUMENTS

| | | | |
|---|---|---|---|
| EP | 1562413 | A2 | 8/2005 |
| EP | 2336395 | A1 | 6/2011 |
| EP | 2624671 | A1 | 8/2013 |
| JP | 51-35711 | | 10/1976 |
| JP | 54-006701 | | 1/1979 |
| JP | 03-122298 | | 5/1991 |
| JP | 07-243088 | | 9/1995 |
| JP | 08-236930 | | 9/1996 |
| JP | 2000269637 | A | 9/2000 |
| JP | 2001062955 | A | 3/2001 |
| JP | 2001-214284 | | 8/2001 |
| JP | 2003-201585 | | 7/2003 |
| JP | 2005048277 | A | 2/2005 |
| JP | 2005193400 | A | 7/2005 |
| JP | 2006103189 | A | 4/2006 |
| JP | 2010013738 | A | 1/2010 |
| JP | WO 2012043182 | A1 * | 4/2012 ............... H05K 3/38 |
| JP | WO 2013187420 | A1 * | 12/2013 ............ H05K 3/384 |
| KR | 20110006626 | A | 1/2011 |
| KR | 20110126128 | A | 11/2011 |
| WO | WO-2004/005588 | A1 | 1/2004 |
| WO | WO-2009/145207 | A1 | 12/2009 |
| WO | WO-2010/110092 | A1 | 9/2010 |

OTHER PUBLICATIONS

International Preliminary Report on Patentability in Application No. PCT/JP2013/058653 dated Oct. 9, 2014.
Extended European Search Report in EP Application No. 13767488.3 dated Dec. 10, 2015.
Partial European Search Report in EP Application No. 15170556.3 dated Dec. 14, 2015.
Extended European Search Report in EP Application No. 16166102 dated Aug. 30, 2016, 8 pages.

* cited by examiner

FIG. 1

Surface roughness of base foil: Rz 2.0 μm or less

D1 at bottom of particle: 10% of particle length from the bottom

D2 at middle of particle: 50% of particle length from the bottom

D3 at end of particle: 90% of partilce length from the bottom

COPPER FOIL WITH CARRIER

CROSS-REFERENCE TO RELATED APPLICATIONS

This is a division of U.S. application Ser. No. 14/388,381, which is the U.S. national phase of PCT/JP2013/058653 filed Mar. 26, 2013, which claims the Convention priority of JP 2012-069660 filed Mar. 26, 2012, the entire respective disclosures of which are incorporated by reference herein.

TECHNICAL FIELD

The present invention relates to a copper foil with a carrier, a method of producing the copper foil with a carrier, a copper foil with a carrier for a printed wiring board, and a printed circuit board. More specifically, the present invention relates to a copper foil with a carrier to be used as a material for printed wiring boards or shielding materials.

BACKGROUND ART

A printed wiring board is generally produced by attaching an insulating substrate to a copper foil to form a copper clad laminate and then forming a conductor pattern on the copper foil surface by etching. Component mounting density and signal frequency have been increased, with the reduction in size and increase in need of high performance of recent electronic devices, and printed wiring boards have been required to have highly fine (fine pitch) conductor patterns and to cope with high frequencies.

Recently, the copper foil having a thickness of 9 μm or less, even 5 μm or less is demanded in accordance with fine pitches. Such an ultra-thin copper foil has low mechanical strength to readily cause tear or wrinkles during production of printed circuit boards. Thus, a copper foil with a carrier composed of a thick metal foil as a carrier and an ultra-thin copper layer electrodeposited onto the metal foil with a release layer therebetween has been developed. The copper foil with a carrier is usually used by bonding the surface of the ultra-thin copper layer to an insulating substrate by thermocompression bonding and then peeling the carrier with the release layer.

The surface of the ultra-thin copper layer of the copper foil with a carrier, i.e., the surface to be bonded to a resin, is primarily required to have a sufficient peel strength between the ultra-thin copper layer and the resin base material and to sufficiently maintain the peel strength after heating to high temperature, wet processing, soldering, chemical treatment, and other treatments.

In general, the peel strength between an ultra-thin copper layer and a resin base material is typically enhanced by allowing a large amount of roughening particles to adhere to the ultra-thin copper layer to increase the profile such as unevenness and roughness of the surface.

However, if such an ultra-thin copper layer having such an increased profile such as unevenness and roughness is applied to a semiconductor package substrate, which is a printed wiring board being particularly required to have a fine circuit pattern, unnecessary copper particles remain during circuit etching to cause defects such as insulation failure between circuit patterns.

Accordingly, a copper foil with a carrier prepared without performing roughening treatment of the ultra-thin copper layer surface has been used as the copper foil with a carrier for fine circuits such as a semiconductor package substrate. The adhesion (peel strength) to a resin of such an ultra-thin copper layer not subjected to roughening treatment is apt to decrease compared to a copper foil for a general printed wiring board due to the low profile such as unevenness, degree of roughness and roughness (see Patent Literature 8). Thus, the copper foil with a carrier needs further improvement.

The copper foil for a semiconductor package substrate is also generally referred to as a copper foil for a printed wiring board and is usually produced by the following procedure. First, a copper foil is laminated and bonded to a base material such as a synthetic resin under high-temperature and high-pressure. Next, in order to form an intended electrically conductive circuit on a substrate, a circuit corresponding to the intended circuit is printed on the copper foil with a material such as an etching resistant resin.

The unnecessary portion of the exposed copper foil is then removed by etching. After the etching, the printed portion of the materials such as the resin is removed to form an electrically conductive circuit on the substrate. The formed electrically conductive circuit is finally formed into a variety of printed circuit boards for electronic devices by soldering specified elements.

Finally, the resulting circuit board is joined to a resist or build-up resin substrate. In general, the quality requirements for a copper foil for a printed wiring board differ between the bonding surface (i.e., roughened surface) to be bonded to a resin base material and the non-bonding surface (i.e., glossy surface). Such different requirements have to be simultaneously satisfied.

The requirements for the glossy surface include (1) satisfactory appearance and no oxidative discoloration during storage, (2) satisfactory solder wettability, (3) no oxidative discoloration during high-temperature heating, and (4) satisfactory adhesion with a resist.

On the other hand, the requirements for the roughened surface mainly include (1) no oxidative discoloration during storage, (2) maintenance of sufficient peel strength with a base material after high-temperature heating, wet processing, soldering, chemical treatment, and other treatment, and (3) no laminate spots after laminating with a base material or etching.

In addition, recent finer patterns demand lower profiles of a copper foil; namely, an increase in peel strength of the roughened surface of a copper foil is necessary in accordance with it.

Furthermore, in electronic devices such as personal computers and mobile communication devices, as the speed and capacity of communication increase, the frequencies of electrical signals are increased. A printed wiring board and a copper foil that can cope with such progress are demanded. An electrical signal frequency of 1 GHz or more significantly increases the influence of a skin effect, the current flowing only on the surface of a conductor, to cause a change in current transmitting path due to the unevenness of the surface and to thereby increase the impedance to a level that is not negligible. From this point, the surface roughness of a copper foil is desired to be small.

In order to satisfy such a requirement, a variety of methods of treating a copper foil for a printed wiring board have been proposed.

In usual treatment of a copper foil for a printed wiring board, a rolled copper foil or an electrolyzed copper foil is used, and roughening treatment, in general, application of microparticles made of copper or copper oxide to the surface of the copper foil, is performed for increasing the adhesiveness (peel strength) between the copper foil and a resin.

Then, in order to give properties of heat-resistant/rustproof, a heat-resistant layer, in another word, 'a barrier layer' of brass or zinc is formed.

In order to avoid surface oxidation or the like during transportation or storage, rust prevention treatment such as immersion or electrolytic chromate treatment or electrolytic chromium/zinc treatment is performed to yield a product.

Among these treatment processes, a roughened layer particularly has an important part in enhancement of the adhesiveness (peel strength) between a copper foil and a resin. Conventionally, roundish or spherical projections have been believed to be suitable for the roughening treatment. Such roundish projections are obtained by suppressing the development of dendrites. However, the roundish projections are detached at the time of etching, causing a phenomenon called "powder fall." Since the contact area between the spherical projection and a copper foil is very small compared to the diameter of the roundish or spherical projection, the phenomenon inevitably occurs.

In order to avoid this "powder fall" phenomenon, a thin copper plating layer is formed on the projections after the roughening treatment to prevent the projections from peeling (see Patent Literature 1) off. This has an effect of preventing "powder fall", but has disadvantages, that is, an increase in the number of steps and a variation in the effect of preventing "powder fall" depending on the thin copper plating.

It is also reported on a technology of forming an acicular nodular coating layer of an alloy of copper and nickel on a copper foil (Patent Literature 2). This nodular coating layer has projections in an acicular form and is thereby believed to show higher adhesion strength with a resin compared to the roundish or spherical projections disclosed in Patent Literature 1. The layer is made of a copper-nickel alloy, which is different from the component of the copper foil serving as the base, and is therefore etched at an etching rate different from that of forming a copper circuit. Consequently, such a layer is unsuitable for a stable circuit design.

In formation of a copper foil for a printed wiring board, a heat-resistant/rustproof layer is usually formed. As examples of the heat-resistant treatment layer of a metal or alloy, coating layers of Zn, Cu—Ni, Cu—Co, or Cu—Zn are applied to a large number of copper foil layers in practical use (e.g., see Patent Literature 3).

In particular, a copper foil provided with a heat-resistant treatment layer made of Cu—Zn (brass) has excellent characteristics such that lamination to a printed circuit board of, for example, an epoxy resin does not cause spots of the resin layer and that the peel strength is hardly decreased by high-temperature heating and is therefore widely used industrially.

Methods of forming the heat-resistant layer from brass are described in detail in Patent Literatures 4 and 5.

It has been proposed to improve the hydrochloric acid resistance by subjecting the surface of a copper foil to roughening treatment, rust prevention treatment with zinc or a zinc alloy, and chromate treatment and then adsorbing a silane coupling agent containing a small amount of chromium ions to the chromate-treated surface (see Patent Literature 7).

CITATION LIST

Patent Literature

Patent Literature 1: Japanese Patent Laid-Open No. H08-236930

Patent Literature 2: Japanese Patent No. 3459964

Patent Literature 3: Japanese Patent Publication No. S51-35711

Patent Literature 4: Japanese Patent Publication No. S54-6701

Patent Literature 5: Japanese Patent No. 3306404

Patent Literature 6: Japanese Patent Application No. 2002-170827

Patent Literature 7: Japanese Patent Laid-Open No. H03-122298

Patent Literature 8: International Publication No. WO2004/005588

SUMMARY OF INVENTION

Technical Problem

The present invention relates to a copper foil with a carrier for a printed wiring board having excellent chemical resistance and adhesive properties, a method of producing the copper foil, a resin substrate for printed wiring boards, and a printed wiring board. In particular, the present invention provides a copper foil with a carrier that can provide high peel strength to a substrate for package, such as a bismaleimide triazine (BT) resin-impregnated base material, in chemical treatment during fine pattern formation to allow fine etching and provides a method of producing the copper foil and a printed wiring board.

Above all, an object of the present invention is to provide a copper foil with a carrier for a printed wiring board, a method of producing the copper foil, a resin substrate for a printed wiring board, and a printed wiring board, wherein the adhesion strength between the copper foil and the resin can be enhanced by improving the roughening treatment to the layer of the copper foil and the steps.

Solution to Problem

The present inventors have diligently studied to solve the above-described problems and as a result, provide the following copper foil with a carrier for a printed wiring board, a method of producing the copper foil, and a printed wiring board:

1) A Copper foil with a carrier comprising a carrier, an intermediate layer, and an ultra-thin copper layer laminated in this order, wherein the ultra-thin copper layer includes a roughened layer on a surface thereof, and the roughened layer comprises particles having an average diameter $D_1$ of 0.2 to 1.0 μm at the particle bottom being apart from the bottom of each particle by 10% of the particle length $L_1$ and having a ratio $L_1/D_1$ of the particle length $L_1$ to the average diameter $D_1$ at the particle bottom of 15 or less;

2) The copper foil with a carrier according to 1) above, wherein on a surface of the ultra-thin copper layer, the ratio $D_2/D_1$ of the average diameter $D_2$ at the particle middle being apart from the bottom of each particle by 50% of the particle length to the average diameter $D_1$ at the particle bottom is 1 to 4;

3) The copper foil with a carrier according to 2) above, wherein the ratio $D_2/D_3$ of the average diameter $D_2$ at the particle middle to the average diameter $D_3$ at the particle end being apart from the bottom of each particle by 90% of the particle length is 0.8 to 1.0;

4) The copper foil with a carrier according to 2) or 3) above, wherein the average diameter $D_2$ at the particle middle is 0.7 to 1.5 μm;

5) The copper foil with a carrier according to 3) or 4) above, wherein the average diameter D3 at the particle end is 0.7 to 1.5 μm;

6) The copper foil with a carrier according to any one of 1) to 5) above, further comprising a heat-resistant/rustproof layer containing at least one element selected from zinc, nickel, copper, phosphorus, and cobalt on the roughened layer, a chromate film layer on the heat-resistant/rustproof layer, and a silane coupling agent layer on the chromate film layer;

7) A method of producing a copper foil with a carrier according to any one of 1) to 6) above, the method comprising forming a roughened layer using a sulfuric acid/copper sulfate electrolytic bath containing at least one material selected from alkyl sulfates, tungsten, and arsenic;

8) The method of producing a copper foil with a carrier according to 7) above, further comprising forming a heat-resistant/rustproof layer containing at least one element selected from zinc, nickel, copper, phosphorus, and cobalt on the roughened layer, forming a chromate film layer on the heat-resistant/rustproof layer, and forming a silane coupling agent layer on the chromate film layer;

9) A copper foil with a carrier for a printed wiring board comprising a carrier, an intermediate layer, and an ultra-thin copper layer laminated in this order, wherein the ultra-thin copper layer includes a roughened layer on a surface thereof; and when the copper foil with a carrier is laminated to a resin layer, then the carrier and the intermediate layer are peeled from the ultra-thin copper layer, and then the ultra-thin copper layer is removed by etching, the sum of areas of holes accounting for the roughened surface of the resin layer having unevenness is 20% or more of the resin surface;

10) The copper foil with a carrier for a printed wiring board, wherein when the copper foil with corrier according to any one of 1) to 8) above comprising the roughened layer is laminated to a resin, then the carrier and the intermediate layer are peeled from the ultra-thin copper layer, and then the ultra-thin copper layer is removed by etching, the sum of areas of holes accounting for the roughened surface of the resin layer having unevenness transferred from the roughened surface of the ultra-thin copper layer is 20% or more of the resin surface;

11) A printed wiring board formed by laminating a resin layer to a copper foil with a carrier including a carrier, an intermediate layer, and an ultra-thin copper layer laminated in this order and including a roughened layer on a surface of the ultra-thin copper layer, peeling the carrier and the intermediate layer from the ultra-thin copper layer, removing the ultra-thin copper layer by etching, plating the exposed resin surface by electroless copper plating and electroplating in this order to form a copper layer, and forming a circuit by etching;

12) A printed wiring board formed by laminating a resin layer to a copper foil with a carrier including a roughened layer according to any one of 1) to 8) above, peeling the carrier and the intermediate layer from the ultra-thin copper layer, removing the ultra-thin copper layer by etching, plating the exposed resin surface by electroless copper plating and electroplating in this order to form a copper layer, and forming a circuit by etching;

13) A printed wiring board formed by laminating a resin layer to the copper foil with a carrier according to any one of 1) to 10) above, peeling the carrier and the intermediate layer from the ultra-thin copper layer, removing the ultra-thin copper layer by etching, and forming a circuit on the exposed resin surface;

14) A printed wiring board formed by laminating a resin layer to the copper foil with a carrier according to any one of 1) to 10) above, peeling the carrier and the intermediate layer from the ultra-thin copper layer, removing the ultra-thin copper layer by etching, forming a copper layer on the exposed resin surface, and forming a circuit;

15) The printed wiring board according to any one of 11) to 14) above, wherein five or more acicular particles are formed within a circuit width of 10 μm;

16) The copper foil with a carrier according to 14) or 15) above, wherein the resin layer is composed of an adhesive resin;

17) The copper foil with a carrier according to any one of 14) to 16) above, wherein the resin layer is composed of a resin in a semi-cured state;

18) A printed wiring board formed by laminating a resin layer to a copper foil with a carrier including a carrier, an intermediate layer, and an ultra-thin copper layer laminated in this order and including a roughened layer on a surface of the ultra-thin copper layer, peeling the carrier and the intermediate layer from the ultra-thin copper layer, removing the ultra-thin copper layer by etching, plating the exposed resins surface by electroless copper plating and electroplating in this order to form a copper layer, and forming a circuit by etching;

19) A printed wiring board formed by laminating a resin layer to a copper foil with a carrier according to any one of 1) to 9) and 12) to 17) above, peeling the carrier and the intermediate layer from the ultra-thin copper layer, removing the ultra-thin copper layer by etching, plating the exposed resin surface by electroless copper plating and electroplating in this order to form a copper layer, and forming a circuit by etching;

20) A printed wiring board formed by laminating a resin layer to a copper foil with a carrier according to any one of 1) to 9) and 12) to 17) above, peeling the carrier and the intermediate layer from the ultra-thin copper layer, removing the ultra-thin copper layer by etching, and forming a circuit on the exposed resin surface;

21) A printed wiring board formed by laminating a resin layer to a copper foil with a carrier according to any one of 1) to 9) and 12) to 17) above, peeling the carrier and the intermediate layer from the ultra-thin copper layer, removing the ultra-thin copper layer by etching, forming a copper layer on the exposed resin surface, and forming a circuit;

22) A printed wiring board produced using the copper foil with a carrier according to any one of 1) to 9) and 12) to 17) above;

23) A printed circuit board produced using the copper foil with a carrier according to any one of 1) to 9) and 12) to 17) above;

24) A copper clad laminate produced using the copper foil with a carrier according to any one of 1) to 9) and 12) to 17) above;

25) The printed wiring board according to any one of 18) to 22) above, wherein five or more acicular particles are formed within a circuit width of 10 μm;

26) The printed circuit board according to 23) above, wherein five or more acicular particles are formed within a circuit width of 10 μm; and 27) A method of producing a printed wiring board, the method comprising the steps of preparing the copper foil with a carrier according to any one of 1) to 9) and 12) to 17) above and an insulating substrate, laminating the copper foil with a carrier and the insulating substrate, peeling the copper foil carrier of the copper foil with a carrier from the laminate comprising the copper foil with a carrier and the insulating substrate to form a copper clad laminate, and forming a circuit by any process selected from a semi-additive process, a subtractive process, a partially additive process, or a modified semi-additive process.

Effects of Invention

As described above, the copper foil with a carrier for a printed wiring board of the present invention includes acicular or rod-like fine roughening particles on at least one surface of the copper foil, instead of the roundish or spherical projections that have been conventionally believed to be good for roughening treatment.

The copper foil has an excellent effect of increasing the adhesion strength with resin to provide high peel strength to a substrate for package in chemical treatment during fine-pattern formation and thereby allowing fine etching of a printed wiring board. The copper foil with a carrier is also useful for a method of increasing adhesion strength with a copper plating layer for a circuit (electroless plating layer) subsequently formed on a surface of a resin by once removing a copper layer completely to transfer a roughened surface to the resin. In recent increases in fineness of printed circuit patterns and in frequency, the copper foil with a carrier for a printed circuit board of the present invention is significantly effective as a copper foil for a printed circuit (copper foil for a semiconductor package substrate) or a substrate for semiconductor package composed of a copper foil for a semiconductor package substrate and a resin for semiconductor package bonded to each other.

DETAILED DESCRIPTION

The present invention will now be described specifically and in detail for facilitating understanding of the present invention. The copper foil used in the present invention may be an electrolyzed copper foil or a rolled copper foil.

As described above, the copper foil with a carrier for a printed wiring board of the present invention includes acicular or rod-like fine roughening copper particles on at least one surface of the copper foil, instead of the roundish or spherical projections that have been conventionally believed to be good for roughening treatment.

The copper foil includes a roughened layer having a shape such that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. More preferably, the roughened layer is provided on at least one surface of the copper foil and has a shape such that the ratio D2/D1 of the average diameter D2 at the particle middle being apart from the bottom of each particle by 50% of the particle length to the average diameter D1 at the particle bottom is 1 to 4.

Furthermore, the ratio D2/D3 of the average diameter D2 at the particle middle to the average diameter D3 at the particle end being apart from the bottom of each particle by 90% of the particle length can be 0.8 to 1.0. In this case, the average diameter D2 at the particle middle is preferably 0.7 to 1.5 μm, and the average diameter D3 at the particle end is preferably 0.7 to 1.5 μm.

Figure 1:
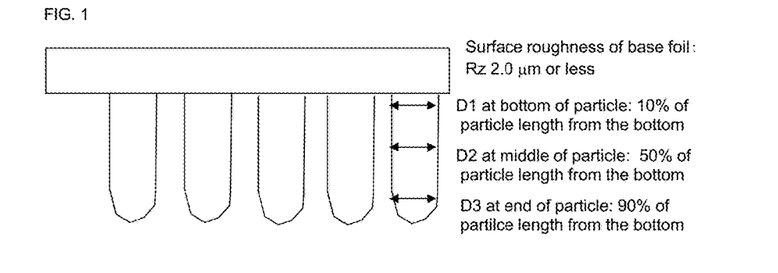
FIG. 1 is a diagram schematically illustrating a particle size.

FIG. 1 is a diagram schematically illustrating a particle size. FIG. 1 shows the average diameter D1 at the particle bottom being apart from the bottom of each particle by 10% of the particle length, the average diameter D2 at the particle middle being apart from the bottom of each particle by 50% of the particle length, and the average diameter D3 at the particle end being apart from the bottom of each particle by 90% of the particle length. This specification can identify the particle shape.

Furthermore, a heat-resistant/rustproof layer containing at least one element selected from zinc, nickel, copper, phosphorus, and cobalt can be formed on the roughened layer, a chromate film layer can be formed on the heat-resistant/rustproof layer, and a silane coupling agent layer can be formed on the chromate film layer.

The roughened layer of such a copper foil can be formed using a sulfuric acid/copper sulfate electrolytic bath containing at least one material selected from alkyl sulfates, tungsten, and arsenic, and the shape described above can be achieved by appropriately setting electrolytic treatment conditions. Furthermore, a heat-resistant/rustproof layer containing at least one element selected from zinc, nickel, copper, phosphorus, and cobalt can be formed on the roughened layer, a chromate film layer can be formed on the heat-resistant/rustproof layer, and a silane coupling agent layer can be formed on the chromate film layer.

The copper foil provided with the roughened layer can be formed into a laminate with a resin by a pressing or lamination process.

Upon removing the copper layer from the laminate composed of the copper foil having a roughened layer and the resin by etching, the unevenness of the roughened surface of the copper foil is transferred to the resin after the removal of the copper layer. The unevenness transferred to the resin corresponds to the shapes and number distribution of the roughening particles on the copper foil surface and is important. If the particles of the rough surface of the copper foil have small diameters at the bottom positions, the transferred holes have small diameters, and the sum of areas of the holes is small.

In the case of particles having small diameters at the bottom positions, i.e., particles in a reverse teardrop shape, of the rough surface of a copper foil, the adhesiveness between the copper foil and a resin is incorrectly thought to increase at first glance, but since the adhering width of the roughening particles with the copper layer is narrow, the roughening particles are apt to break at the bottom when the copper layer is peeled from the resin layer. As a result, the copper layer is peeled at the interface between the copper layer and the roughening particles or at the broken bottom portion of the roughening particles resulting in decreased adherence. The sum of areas of the holes is required to account for 20% or more of the resin surface.

If the particles of the rough surface of the copper foil have small diameters at the bottom positions, the holes formed on the resin surface after removing the copper layer by etching have small sizes. Consequently, even in electroless plating of the resin surface, the electroless plating solution cannot enter the holes, resulting in incomplete electroless plating, which causes a problem of, a reduction in the peel strength of the plating.

Thus, the particles of roughened surface of a copper foil need to have a certain diameter and a certain length, and the sum of areas of the holes accounting for the resin surface having unevenness transferred from the rough surface of the copper foil is important. The peel strength of a circuit can be improved by increasing the sum to 20% or more.

As described above, a printed wiring board can be produced by laminating a copper foil including a roughened layer to a resin layer, removing the copper layer by etching, plating the exposed resin surface by electroless copper plating and copper electroplating in this order to form a copper layer, and forming a circuit by etching. An electroless plating/electroplating layer, i.e., a copper layer is formed on the unevenness of the rough surface of the resin substrate to form acicular or rod-like particles reflecting the unevenness of the resin surface.

It is preferable to form five or more acicular or rod-like particles within a circuit width of 10 μm. By doing so, the adhesion strength between the resin and the circuit layer by electroless plating can be notably improved. The present invention provides a printed wiring board produced as in above.

As described above, the roughened layer composed of acicular or rod-like fine roughening particles of copper can be produced using a sulfuric acid/copper sulfate electrolytic bath containing at least one material selected from alkyl sulfates, tungsten, and arsenic.

The roughened layer composed of acicular fine roughening particles of copper is preferably subjected to overlay plating in a sulfuric acid/copper sulfate electrolytic bath for preventing powder fall and improving the peel strength.

Specific treatment conditions are as follows:
(Liquid Composition 1)
Cu: 10 to 30 g/L
$H_2SO_4$: 10 to 150 g/L
W: 0 to 50 mg/L
Sodium dodecyl sulfate: 0 to 50 mg
As: 0 to 2000 mg/L
(Electroplating Condition 1)
Temperature: 30 to 70° C.
(Electric Current Condition 1)
Current density: 25 to 110 A/dm$^2$
Roughening coulomb quantity: 50 to 500 As/dm$^2$
Plating time: 0.5 to 20 seconds
(Liquid Composition 2)
Cu: 20 to 80 g/L
$H_2SO_4$: 50 to 200 g/L
(Electroplating Condition 2)
Temperature: 30 to 70° C.
(Electric Current Condition 2)
Current density: 5 to 50 A/dm$^2$
Roughening coulomb quantity: 50 to 300 As/dm$^2$
Plating time: 1 to 60 seconds Furthermore, a heat-resistant/rustproof layer containing at least one element selected from zinc, nickel, copper, phosphorus, and cobalt is formed on the roughened layer, a chromate film layer is formed on the heat-resistant/rustproof layer, and a silane coupling agent layer is formed on the chromate film layer to give a copper foil for a printed wiring board.

Any conventional heat-resistant/rustproof layer can be used as the heat-resistant/rustproof layer without particular limitation. For example, a brass coating layer, which has been conventionally used, can be used in the copper foil for a semiconductor package substrate.

On the heat-resistant/rustproof layer, a chromate film layer and a silane coupling agent layer are formed, which are used as bonding surfaces to at least the resin of a copper foil. The copper foil having a coating layer composed of these chromate film layer and silane coupling agent layer is laminated and bonded to a resin. An etching resistant printed circuit is further formed on the copper foil, and then unnecessary portion of the copper foil excluding the printed circuit portion is removed by etching to form an electrically conductive circuit.

For a heat resistant and rust proof layer, existing treatments can be used. Specifically, the followings can be used as an example:
(Liquid Composition)
NaOH: 40 to 200 g/L
NaCN: 70 to 250 g/L
CuCN: 50 to 200 g/L
$Zn(CN)_2$: 2 to 100 g/L
$As_2O_3$: 0.01 to 1 g/L
(Liquid Temperature)
40 to 90° C.
(Electric Current Condition)
Current density: 1 to 50 A/dm$^2$
Plating time: 1 to 20 seconds As the chromate film layer, an electrolytic chromate film layer or an immersion chromate film layer can be used. Preferably, the chromate film layer contains 25 to 150 μg/dm$^2$ of Cr.

A Cr amount less than 25 μg/dm$^2$ does not show an effect as a rustproof layer. In a Cr amount exceeding 150 μg/dm$^2$, the effect is saturated, and such an amount is therefore wasteful. Thus, preferably, the Cr amount is 25 to 150 μg/dm$^2$.

Examples of the conditions for forming the chromate film layer are shown below. As described above, however, the conditions are not limited thereto, and various known chromate treatment processes can be employed. This rust prevention treatment is one factor that affects acid resistance, and chromate treatment improves the acid resistance.

(a) Immersion Chromate Treatment
$K_2Cr_2O_7$: 1 to 5 g/L, pH: 2.5 to 4.5, temperature: 40 to 60° C.,
time: 0.5 to 8 seconds (b) Electrolytic Chromate Treatment (Chromium/Zinc Treatment (Alkaline Bath))
$K_2Cr_2O_7$: 0.2 to 20 g/L, acid: phosphoric acid, sulfuric acid, organic acid, pH: 1.0 to 3.5, temperature: 20 to 40° C., current density: 0.1 to 5 A/dm$^2$,
time: 0.5 to 8 seconds (c) Electrolytic Chromium/Zinc Treatment (Alkaline Bath)
$K_2Cr_2O_7$ ($Na_2Cr_2O_7$ or $CrO_3$): 2 to 10 g/L, NaOH or KOH: 10 to 50 g/L, ZnOH or $ZnSO_4 \cdot 7H_2O$: 0.05 to 10 g/L, pH: 7 to 13,
bath temperature: 20 to 80° C., current density: 0.05 to 5 A/dm$^2$, time: 5 to 30 seconds (d) Electrolytic Chromate Treatment (Chromium/Zinc Treatment (Acidic Bath))
$K_2Cr_2O_7$: 2 to 10 g/L, Zn: 0 to 0.5 g/L, $Na_2SO_4$: 5 to 20 g/L, pH: 3.5 to 5.0, bath temperature: 20 to 40° C., current density: 0.1 to 3.0 A/dm$^2$, time: 1 to 30 seconds As the silane coupling agent layer used in the copper foil for a semiconductor package substrate of the present invention, a silane coupling agent that is usually used in a copper foil can be used without particular limitation. For example, specific conditions for silane treatment are as follows.

An aqueous 0.2 vol % 3-glycidoxypropyltrimethoxysilane solution is sprayed and then heating and drying is performed in an air of 100 to 200° C. for 0.1 to 10 seconds.

A silane coupling agent containing a tetraalkoxysilane and at least one alkoxysilane having a functional group reactive to a resin can be used. Any silane coupling agent layer can also be used, but preferably, the silane coupling agent is selected in the light of adhesive properties with resin.

(Carrier)

As the carrier of the copper foil with a carrier of the present invention, a foil such as a copper foil, an aluminum foil, an aluminum alloy foil, an iron alloy foil, a stainless steel foil, a nickel foil, or a nickel alloy foil can be used. Preferably, a copper foil is used in view of easiness in lamination of an intermediate layer onto a carrier. The copper foil used in the carrier is typically provided in a form of rolled or electrolyzed. The electrolyzed copper foil is generally produced by electrolytically depositing copper onto a drum of titanium or stainless steel from a copper sulfate plating bath. The rolled copper foil is produced by plastic forming via rolling roll and heat treatment repeatedly.

Examples of usable materials for a copper foil include a high-purity copper such as a tough pitch copper and an oxygen-free copper, Sn-containing copper alloys, Ag-containing copper alloys, Cr-, Zr-, or Mg-added copper alloys, and copper alloys such as Corson based alloy containing Ni and Si. Throughout the specification, the term "copper foil" used alone includes copper alloy foil.

The carrier used in the present invention may have any thickness without particular limitation. The thickness of the carrier may be appropriately controlled so as to achieve the purpose, such as 12 μm or more. Since an excessive thickness, however, increases the production cost, in general, the thickness is preferably 35 μm or less. Thus, the carrier preferably has a thickness of 12 to 70 μm and more preferably 18 to 35 μm.

(Intermediate Layer)

An intermediate layer is disposed on the carrier. The intermediate layer of the copper foil with a carrier of the present invention is preferably a layer containing at least one selected from the group consisting of Cr, Ni, Co, Fe, Mo, Ti, W, P, Cu, and Al, alloys, hydrates, and oxides thereof, and organic compounds. The intermediate layer may be a multilayer.

For example, the intermediate layer is constituted of, from the carrier side, a monometal layer of one element selected from the group consisting of Cr, Ni, Co, Fe, Mo, Ti, W, P, Cu, and Al or an alloy layer of one or more elements selected from the group consisting of Cr, Ni, Co, Fe, Mo, Ti, W, P, Cu, and Al; and a layer of a hydrate or oxide of one or more elements selected from the group consisting of Cr, Ni, Co, Fe, Mo, Ti, W, P, Cu, and Al.

Furthermore, the intermediate layer may be constituted of, for example, two layers of Ni and Cr. The Ni layer and the Cr layer are laminated such that the Ni layer is in contact with the interface with the copper foil carrier and that the Cr layer is in contact with the interface with the ultra-thin copper layer. The deposition amount of Cr of the intermediate layer can be 10 to 100 μg/dm$^2$, and the deposition amount of Ni can be 1000 to 40000 μg/dm$^2$.

(Ultra-Thin Copper Layer)

An ultra-thin copper layer is disposed on the intermediate layer. The ultra-thin copper layer of the copper foil with a carrier of the present invention can be formed by electroplating using an electrolytic bath of copper sulfate, copper pyrophosphate, copper sulfamate, or copper cyanide and the like. Preferably, a copper sulfate bath, which is generally used in electrolyzed a copper foil and allows formation of a copper foil at a high current density, is used. The ultra-thin copper layer may have any thickness without particular limitation and generally has a thickness smaller than that of the carrier, e.g., 12 μm or less. The thickness is preferably 0.1 to 12 μm, more preferably 0.5 to 12 μm, and most preferably 2 to 5 μm.

(Copper Foil with a Carrier)

Thus, an intermediate layer is laminated to a carrier, and a copper foil with a carrier including an ultra-thin copper layer laminated to the intermediate layer is produced.

The copper foil with a carrier including a carrier, an intermediate layer laminated to the carrier, and an ultra-thin copper layer laminated to the intermediate layer may include a roughened layer on the ultra-thin copper layer and may include at least one layer selected from the group consisting of heat-resistant/rustproof layers, chromate film layers, and silane coupling agent layers on the roughened layer.

The roughened layer may be disposed on the ultra-thin copper layer, a heat-resistant/rustproof layer may be disposed on the roughened layer, a chromate film layer may be disposed on the heat-resistant/rustproof layer, and a silane coupling agent layer may be disposed on the chromate film layer.

In the copper foil with a carrier, a resin layer may be disposed on the roughened layer, on the heat-resistant/rustproof layer, chromate film layer, or silane coupling agent layer. The resin layer may be an insulating resin layer.

The resin layer may be an adhesive agent or may be an insulating resin layer in a semi-cured state (B stage) for bonding. In the semi-cured state (B stage state), no adhesive feeling is given when a finger touches the surface of the layer, the insulating resin layers can be stored in a stacked state, and also a curing reaction is caused by heat treatment.

The resin layer may contain a thermosetting resin or may be a thermoplastic resin. The resin layer may contain a thermoplastic resin. The type of the resin is not particularly limited, and preferred examples of the resin include epoxy resins, polyimide resins, polyfunctional cyanic ester compounds, maleimide compounds, polyvinyl acetal resins, and urethane resins.

Such a resin is dissolved in a solvent such as methyl ethyl ketone (MEK) or toluene to prepare a resin solution; the resin solution is applied onto the ultra-thin copper layer or the heat-resistant/rustproof layer, chromate film layer, or silane coupling agent layer by roll coater, for example; and then the solvent is removed by heat drying as necessary to give the B stage state. The drying may be performed, for example, using a hot-air drying furnace at a drying temperature of 100 to 250° C., preferably 130 to 200° C.

The copper foil with a carrier having the resin layer (a resin-provided copper foil with a carrier) is used as follows: The resin layer is laminated to a base material and is thermally cured by thermocompression bonding thereof; the carrier is peeled to expose the ultra-thin copper layer (the surface of the ultra-thin copper layer on the intermediate layer side); and a predetermined wiring pattern is formed on the exposed ultra-thin copper layer surface.

The use of the resin-provided copper foil with a carrier can reduce the number of sheets of the prepreg material used in production of a multilayer printed circuit board. In addition, it is possible to control the thickness of the resin layer for securing interlayer insulation or to produce a copper clad laminate without using any prepreg material at all. On this occasion, it is also possible to further improve the smoothness of the surface of the base material by undercoating the surface with an insulating resin.

The case not using any prepreg material can save the material cost for the prepreg material and simplify the lamination step, which is economically advantageous and also reduces the thickness of the resulting multilayer printed circuit board by an amount corresponding to the thickness of the prepreg material. As a result, advantageously, an ultra-thin multilayer printed circuit board, each layer of which has a thickness of 100 μm or less, can be produced.

The thickness of the resin layer is preferably 0.1 to 80 μm.

A thickness of the resin layer of less than 0.1 μm gives a low adhesive strength. Thus, if the resin-provided copper foil with a carrier is laminated to a base material including an inner layer material without interposing a prepreg material therebetween, it may be difficult to secure interlayer insulation between the resin layer and the circuit of the inner layer material.

In contrast, a resin layer having a thickness exceeding 80 μm is difficult to be formed by application only once, which requires extra material cost and step and is therefore economically disadvantageous. And, the resulting resin layer is inferior in flexibility to readily cause, for example, cracks during handling or may cause excessive resin flow during thermocompression bonding with an inner layer material, resulting in difficulty in smooth lamination.

Furthermore, in another product form of the resin-provided copper foil with a carrier, it is also possible to produce in a form of a resin-provided copper foil not having a carrier by forming a resin layer so as to coat the ultra-thin copper layer, the heat-resistant/rustproof layer, chromate film layer, or silane coupling agent layer; semi-curing the resin; and the peeling the carrier.

It is known to those skilled in the art how to use the copper foil with a carrier itself. For example, the surface of the ultra-thin copper layer is bonded to an insulating substrate such as a paper base phenolic resin, a paper base epoxy resin, a synthetic fiber fabric base epoxy resin, a glass fabric/paper composite base epoxy resin, a glass fabric/nonwoven glass fabric composite base epoxy resin, a glass fabric base epoxy resin, a polyester film, or a polyimide film. After thermocompression bonding, the carrier is peeled. The ultra-thin copper layer bonded to the insulating substrate is etched into an intended conductor pattern to finally produce a printed wiring board. Electronic parts are further mounted on the printed wiring board to give a printed circuit board. Some examples of processes of producing a printed wiring board including the copper foil with a carrier of the present invention will now be described.

In an embodiment of the method of producing the printed wiring board of the present invention, the method includes a step of preparing a copper foil with a carrier of the present invention and an insulating substrate, a step of laminating the copper foil with a carrier and the insulating substrate such that the ultra-thin copper layer side of the copper foil with a carrier faces the insulating substrate, a step of peeling the carrier of the copper foil with a carrier to form a copper clad laminate, and a step of forming a circuit by any of a semi-additive process, a modified semi-additive process, a partially additive process, and a subtractive process. The insulating substrate may include an innerlayer circuit.

The semi-additive process in the present invention refers to a method of forming thin plating on an insulating substrate or a copper foil seed layer by electroless plating, forming a pattern, and forming a conductor pattern by electroplating and etching.

Accordingly, in an embodiment of the method of producing the printed wiring board of the present invention employing the semi-additive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of completely removing the ultra-thin copper layer, exposed by the peeling of the carrier, by a process such as etching using an etchant such as an acid or plasma etching, a step of providing a through-hole and/or a blind via in the resin exposed by the removal of the ultra-thin copper layer by etching, a step of subjecting the region containing the through-hole and/or the blind via to desmear treatment, a step of providing an electroless plating layer to the resin and the region containing the through-hole and/or the blind via, a step of providing a plating resist on the electroless plating layer, a step of exposing the plating resist to light and then removing the plating resist in the region where a circuit is formed, a step of providing an electroplating layer to the plating resist-removed region where the circuit is formed, a step of removing the plating resist, and a step of removing the electroless plating layer in the region excluding the region where the circuit is formed by, for example, flash etching.

In another embodiment of the method of producing the printed wiring board of the present invention employing the semi-additive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of completely removing the ultra-thin copper layer, exposed by the peeling of the carrier, by a process such as etching using an etchant such as an acid or plasma etching, a step of providing an electroless plating layer on the surface of the resin exposed by removing the ultra-thin copper layer by etching, a step of providing a plating resist on the electroless plating layer, a step of exposing the plating resist to light and then removing the plating resist in the region where a circuit is formed, a step of providing an electroplating layer to the plating resist-removed region where the circuit is formed, a step of removing the plating resist, and a step of removing the electroless plating layer and the ultra-thin copper layer in the region excluding the region where the circuit is formed by, for example, flash etching.

The modified semi-additive process in the present invention refers to a method of forming a circuit on an insulating layer by laminating metal foil to the insulating layer, protecting a region where the circuit is not formed by a plating resist, thickening the copper in the circuit-forming region by electroplating, removing the resist, and removing the metal foil in the region excluding the circuit-forming region by (flash) etching.

Accordingly, in an embodiment of the method of producing the printed wiring board of the present invention employing the modified semi-additive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of providing a through-hole and/or a blind via in the ultra-thin copper layer and the insulating substrate exposed by the peeling of the carrier, a step of subjecting the region containing the through-hole and/or the blind via to desmear treatment, a step of providing an electroless plating layer in the region containing the through-hole and/or the blind via, a step of providing a plating resist on the surface of the ultra-thin copper layer exposed by peeling of the carrier, a step of forming a circuit by electroplating after the provision of the plating resist, a step of removing the plating resist, and a step of removing the ultra-thin copper layer, exposed by the removal of the plating resist, by flash etching.

In another embodiment of the method of producing the printed wiring board of the present invention employing the modified semi-additive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of providing a plating resist on the ultra-thin copper layer exposed by the peeling of the carrier, a step of exposing the plating resist to light and then removing the plating resist in the region where a circuit is formed, a step of providing an electroplating layer to the plating resist-removed region where the circuit is formed, a step of removing the plating resist, and a step of removing the electroless plating layer and the ultra-thin copper layer in the region excluding the region where the circuit is formed by, for example, flash etching.

The partially additive process in the present invention refers to a method of producing a printed wiring board by applying a catalytic nucleus onto a substrate provided with a conductor layer and optionally provided with a hole as a through-hole or via-hole, forming a conductor circuit by etching, optionally providing a solder resist or a plating resist, and then performing electroless plating treatment on the conductor circuit, the through-hole or via-hole, for thickening.

Accordingly, in an embodiment of the method of producing the printed wiring board of the present invention employing the partially additive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of providing a through-hole and/or a blind via in the ultra-thin copper layer and the insulating substrate exposed by the peeling of the carrier, a step of subjecting the region containing the through-hole and/or the blind via to desmear treatment, a step of applying a catalytic nucleus to the region containing the through-hole and/or the blind via, a step of providing an etching resist on the surface of the ultra-thin copper layer exposed by the peeling of the carrier, a step of forming a circuit pattern by exposing the etching resist to light, a step of forming a circuit by removing the ultra-thin copper layer and the catalytic nucleus by a process such as etching using an etchant such as an acid or plasma etching, a step of removing the etching resist, a step of providing a solder resist or plating resist on the surface of the insulating substrate exposed by the removal of the ultra-thin copper layer and the catalytic nucleus by a process such as etching using an etchant such as an acid or plasma etching, and a step of providing an electroless plating layer in the region not having the solder resist or plating resist.

The subtractive process in the present invention refers to a method of forming a conductor pattern by selectively removing the unnecessary portion of the copper foil on a copper clad laminate by, for example, etching.

Accordingly, in an embodiment of the method of producing the printed wiring board of the present invention employing the subtractive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of providing a through-hole and/or a blind via in the ultra-thin copper layer and the insulating substrate exposed by the peeling of the carrier, a step of subjecting the region containing the through-hole and/or the blind via to desmear treatment, a step of providing an electroless plating layer in the region containing the through-hole and/or the blind via, a step of providing an electroplating layer on the surface of the electroless plating layer, a step of providing an etching resist on the surface of the electroplating layer and/or the ultra-thin copper layer, a step of forming a circuit pattern by exposing the etching resist to light, a step of forming a circuit by removing the ultra-thin copper layer, the electroless plating layer, and the electroplating layer by a process such as etching using an etchant such as an acid or plasma etching, and a step of removing the etching resist.

In another embodiment of the method of producing the printed wiring board of the present invention employing the subtractive process, the method includes a step of preparing a copper foil with a carrier of the present invention and an insulating substrate, a step of laminating the copper foil with a carrier and the insulating substrate, a step of peeling the carrier of the copper foil with a carrier from the laminate composed of the copper foil with a carrier and the insulating substrate, a step of providing a through-hole and/or a blind via in the ultra-thin copper layer and the insulating substrate exposed by the peeling of the carrier, a step of subjecting the region containing the through-hole and/or the blind via to desmear treatment, a step of providing an electroless plating layer in the region containing the through-hole and/or the blind via, a step of forming a mask on the surface of the electroless plating layer, a step of providing an electroplating layer on the surface of the electroless plating layer not provided with the mask, a step of providing an etching resist on the surface of the electroplating layer and/or the ultra-thin copper layer, a step of forming a circuit pattern by exposing the etching resist to light, a step of forming a circuit by removing the ultra-thin copper layer and the electroless plating layer by a process such as etching using an etchant such as an acid or plasma etching, and a step of removing the etching resist.

The step of providing a through-hole and/or a blind via and the subsequent desmear step may be omitted. In the case of the copper foil with a carrier of the present invention, the peeling position is mainly the interface between the carrier and the intermediate layer or the interface between the intermediate layer and the ultra-thin copper layer. When the intermediate layer is a multilayer, peeling may be performed at the interfaces of the multiple layers.

EXAMPLES

The present invention will now be described by examples and comparative examples. The following examples are preferred one, and the scope of the present invention should not be limited to these examples. Accordingly, modification and other examples or embodiments included in the technical idea of the present invention are all included in the present invention.

For comparison with the present invention, comparative examples are also shown.

A long electrolyzed copper foil (JTC, manufactured by JX Nippon Mining & Metals Corporation) having a thickness of 35 μm was used as a carrier. On the glossy surface (shiny surface) of this copper foil, a Ni layer was formed at a deposition amount of 4000 μg/dm$^2$ by electroplating with continuous roll-to-roll plating line under the following conditions.

(Ni Layer)
Nickel sulfate: 200 to 300 g/L
Trisodium citrate: 2 to 10 g/L
pH: 2 to 4
Bath temperature: 40 to 70° C.
Current density: 1 to 15 A/dm$^2$ After washing with water and pickling, a Cr layer was subsequently deposited on the Ni layer at a deposition amount of 11 μg/dm$^2$ by electrolytic chromate treatment using continuous roll-to-roll plating line under the following conditions.

(Electrolytic Chromate Treatment)
Liquid composition: potassium dichromate: 1 to 10 g/L, zinc: 0 to 5 g/L
pH: 3 to 4
Liquid temperature: 50 to 60° C.
Current density: 0.1 to 2.6 A/dm$^2$
Coulomb quantity: 0.5 to 30 As/dm$^2$ Subsequently, an ultra-thin copper layer having a thickness of 2 to 15 μm was formed on the Cr layer by electroplating with continuous roll-to-roll plating line under the conditions shown in Examples and Comparative Examples below to produce a copper foil with a carrier.

Ultra-thin copper layer
Copper concentration: 30 to 120 g/L
H$_2$SO$_4$ concentration: 20 to 120 g/L
Electrolytic solution temperature: 20 to 80° C.
Glue: 1 to 20 ppm
Current density: 10 to 100 A/dm$^2$ Example 1

The rough surface (mat surface: M surface) of a copper foil with a carrier (thickness of ultra-thin copper layer: 5 μm, roughness Rz of roughness-forming surface of ultra-thin copper layer: 0.6 μm) treated as described above was subjected to roughening plating as follows. The treatment conditions are shown below. These are all steps for forming the roughened layer in the copper foil of the present invention. The ratio of current density to limiting current density during roughening particle formation was adjusted to 2.50.

(Liquid Composition 1)
Cu: 15 g/L
H$_2$SO$_4$: 100 g/L
W: 3 mg/L
Sodium dodecyl sulfate amount: 10 ppm
(Electroplating Temperature 1): 50° C.

After the roughening treatment, normal plating shown below was performed. The treatment conditions were as follows.

(Liquid Composition 2)
Cu: 40 g/L
H$_2$SO$_4$: 100 g/L
(Electroplating Temperature 1): 40° C.
(Electric Current Condition 1)
Current density: 30 A/dm$^2$
Roughening coulomb quantity: 150 As/dm$^2$ Subsequently, a heat-resistant/rustproof layer was subjected to electrolytic chromate treatment.

Electrolytic Chromate Treatment (Chromium/Zinc Treatment (Acidic Bath))
CrO$_3$: 1.5 g/L
ZnSO$_4$.7H$_2$O: 2.0 g/L
Na$_2$SO$_4$: 18 g/L
pH: 4.6
Bath temperature: 37° C.
Current density: 2.0 A/dm$^2$
Time: 1 to 30 seconds
(The pH was adjusted with sulfuric acid or potassium hydroxide.)

Subsequently, the chromate film layer was subjected to silane treatment (by application).

The silane treatment conditions were as follows.
3-Glycidoxypropyltrimethoxysilane: 0.2%

Figure 2:
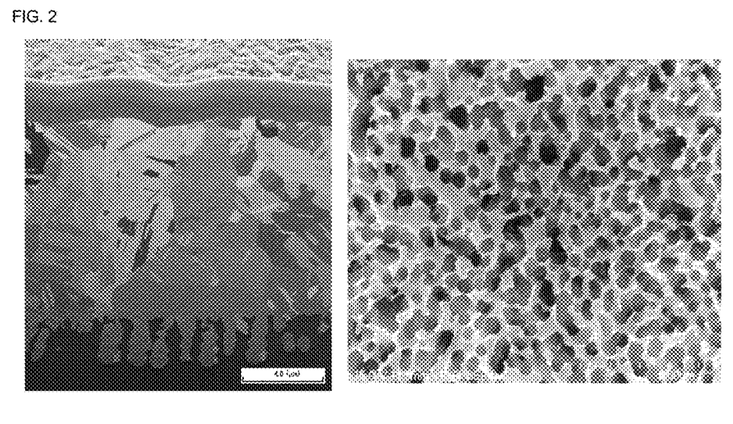
FIG. 2 shows an FIB-SIM photograph (the left) of the roughened layer of Example 1 and an SEM photograph (the right) of a resin (replica) surface prepared by laminating a resin to a copper layer and then removing the copper layer by etching.

An FIB-SIM photograph of the roughened layer of Example 1 is shown in the left of FIG. 2. In this roughened layer, the surface roughness Rz was 1.17 μm, the average diameter D1 at the particle bottom being apart from the bottom of each particle by 10% of the particle length was 0.57 μm, the particle length L1 was 2.68 μm, and the ratio L1/D1 of the particle length L1 to the average diameter D1 at the particle bottom was 4.74. FIG. 2 shows that the roughened layer was formed in an acicular or rod-like particle shape. The diameters of the roughening particles were measured in accordance with JIS H 0501, Section 7, Cutting method.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

Table 1 also shows other data of the roughening particles, i.e., average diameter (width) D1 at the particle bottom: 0.57, average diameter D2 at the particle middle: 0.83, average diameter D3 at the particle end: 0.68, ratio D2/D1 of the average diameter at the middle position to that at the bottom position: 1.47, ratio D3/D1 of the average diameter at the end position to that at the bottom position: 1.21, and ratio D3/D2 of the average diameter at the end position to that at the middle position: 0.83. These results all satisfied the preferred requirements of the present invention.

It should be readily understood that these are not fundamental requirements, i.e., not indispensable requirements of the present invention and that these are preferred requirements.

Subsequently, the copper foil was laminated to a resin GHPL-830MBT. The copper layer laminated to the resin was removed by etching. An SEM photograph of the surface of the resin (replica) after the removal of the copper layer is shown in the right of FIG. 2.

It was observed that the sum of areas of holes accounting for the resin surface having the unevenness transferred from the roughened surface of the copper foil was 51% and that the density of the holes was 2.10 holes/μm2. Thus, the requirement of the present invention that the sum of areas of holes accounts for 20% or more was satisfied.

The copper foil was laminated to the resin (GHPL-830MBT) as described above, and peel strengths of the laminate in a normal state and after heating were measured. The results are also shown in Table 1. The circuit width for the peel strength was 10 mm. The peel strength in a normal state was 1.01 kg/cm, and the peel strength after heating was 0.94 kg/cm. Both peel strengths were higher than those in Comparative Examples described below.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

TABLE 1

| | Intermediate layer | Ratio of current density to limiting current density during roughening particle formation | Peel strength | | Roughness (μm) | Roughening particles | | | | | | | | Replica | | |
|---|---|---|---|---|---|---|---|---|---|---|---|---|---|---|---|---|
| | | | Normal state | After heating | | Bottom width D1 | Middle D2 | End D3 | D2/D1 | D3/D1 | D3/D2 | Length | Ratio (length/width) | Density (particles/μm²) | Area ratio (%) | |
| | | | (kg/cm) | | | | | | | | | | | | | |
| Comparative Example 1 | Ni/chromate | 10.50 | 0.54 | 0.53 | 1.13 | 0.12 | 0.74 | 0.74 | 5.93 | 5.93 | 1.00 | 3.87 | 30.97 | 1.06 | 2% | |
| Comparative Example 2 | Ni/chromate | 9.50 | 0.58 | 0.49 | 1.02 | 0.15 | 0.65 | 0.65 | 4.25 | 4.25 | 1.00 | 2.83 | 18.54 | 2.11 | 4% | |
| Comparative Example 3 | Ni/chromate | 9.80 | 0.73 | 0.69 | 0.88 | 0.14 | 0.65 | 0.65 | 4.50 | 4.50 | 1.00 | 2.98 | 20.64 | 3.12 | 14% | |
| Example 1 | Ni/chromate | 2.50 | 1.01 | 0.94 | 1.17 | 0.57 | 0.83 | 0.68 | 1.47 | 1.21 | 0.83 | 2.68 | 4.74 | 2.10 | 51% | |
| Example 2 | Ni/chromate | 3.10 | 0.81 | 0.78 | 1.51 | 0.51 | 0.78 | 0.68 | 1.51 | 1.32 | 0.87 | 2.68 | 5.21 | 1.93 | 29% | Preferred value |
| Example 3 | Ni/chromate | 4.30 | 0.84 | 0.77 | 1.56 | 0.59 | 0.73 | 0.65 | 1.23 | 1.10 | 0.89 | 2.68 | 4.52 | 1.77 | 43% | |
| Example 4 | Ni/chromate | 3.50 | 0.90 | 0.86 | 1.62 | 0.89 | 1.05 | 0.98 | 1.18 | 1.10 | 0.93 | 2.98 | 3.33 | 2.02 | 78% | |
| Example 5 | Ni/chromate | 4.80 | 0.91 | 0.84 | 1.01 | 0.26 | 0.84 | 0.79 | 3.23 | 3.06 | 0.95 | 2.68 | 10.34 | 2.65 | 40% | |
| Example 6 | Ni/chromate | 3.20 | 0.91 | 0.91 | 1.48 | 0.60 | 0.84 | 0.78 | 1.39 | 1.30 | 0.94 | 2.68 | 4.44 | 2.22 | 93% | |

Resin: MBT-830
Peel strength measurement circuit width: 10 mm
Roughening particle bottom width measurement process: JIS H 0501 Section 7 Cutting method Example 2

The rough surface (mat surface: M surface) of a copper foil with a carrier (thickness of ultra-thin copper layer: 5 μm, roughness Rz of roughness-forming surface of ultra-thin copper layer: 0.6 μm) treated as described above was subjected to roughening plating as follows and to normal plating as in Example 1. The treatment conditions for the roughening plating are shown below. These are all steps for forming the roughened layer of the copper foil of the present invention. The ratio of current density to limiting current density during roughening particle formation was adjusted to 3.10.

(Liquid Composition 1)
Cu: 15 g/L
$H_2SO_4$: 100 g/L
W: 3 mg/L
Sodium dodecyl sulfate amount: 10 ppm
(Electroplating Temperature 1): 50° C.

In this roughened layer, the surface roughness Rz was 1.51 μm, the average diameter D1 at the particle bottom being apart from the bottom of each particle by 10% of the particle length was 0.51 μm, the particle length L1 was 2.68 μm, and the ratio L1/D1 of the particle length L1 to the average diameter D1 at the particle bottom was 5.21. It was presumed from FIG. 2 that the roughened layer was formed in an acicular or rod-like particle shape. The diameters of the roughening particles were measured in accordance with JIS H 0501, Section 7, Cutting method.

Table 1 also shows other data of the roughening particles, i.e., average diameter (width) D1 at the particle bottom: 0.51 μm, average diameter D2 at the particle middle: 0.78 μm, average diameter D3 at the particle end: 0.68 μm, ratio D2/D1 of the average diameter at the middle position to that at the bottom position: 1.51, ratio D3/D1 of the average diameter at the end position to that at the bottom position: 1.32, and ratio D3/D2 of the average diameter at the end position to that at the middle position: 0.87. These results all satisfied the preferred requirements of the present invention.

It should be readily understood that these are not fundamental requirements, i.e., not indispensable requirements of the present invention and that these are preferred requirements.

Subsequently, the copper foil was laminated to a resin GHPL-830MBT (product name, manufactured by Mitsubishi Gas Chemical Company, Inc.), and the copper layer was removed by etching. It was observed that the sum of areas of holes accounting for the resin surface having the unevenness transferred from the roughened surface of the copper foil was 29% and that the density of the holes was 1.93 holes/μm². Thus, the requirement of the present invention that the sum of areas of holes accounts for 20% or more was satisfied.

The copper foil was laminated to the resin as described above, and peel strengths of the laminate in a normal state and after heating were measured. The results are also shown in Table 1. The circuit width for the peel strength was 10 mm. The peel strength in a normal state was 0.81 kg/cm, and the peel strength after heating was 0.78 kg/cm. Both peel strengths were higher than those in Comparative Examples described below.

Example 3

The rough surface (mat surface: M surface) of a copper foil with a carrier (thickness of ultra-thin copper layer: 5 μm, roughness Rz of roughness-forming surface of ultra-thin copper layer: 0.6 μm) treated as described above was subjected to roughening plating as follows and to normal plating as in Example 1. The treatment conditions for the roughening plating are shown below. These are all steps for forming the roughened layer of the copper foil of the present invention. The ratio of current density to limiting current density during roughening particle formation was adjusted to 4.30.
 (Liquid Composition 1)
 Cu: 15 g/L
 $H_2SO_4$: 100 g/L
 W: 3 mg/L
 Sodium dodecyl sulfate amount: 10 ppm
 (Electroplating Temperature 1): 50° C.

In this roughened layer, the surface roughness Rz was 1.56 μm, the average diameter D1 at the particle bottom being apart from the bottom of each particle by 10% of the particle length was 0.59 μm, the particle length L1 was 2.68 μm, and the ratio L1/D1 of the particle length L1 to the average diameter D1 at the particle bottom was 4.52. It was presumed from FIG. 2 that the roughened layer was formed in an acicular or rod-like particle shape. The diameters of the roughening particles were measured in accordance with JIS H 0501, Section 7, Cutting method.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

Table 1 also shows other data of the roughening particles, i.e., average diameter (width) D1 at the particle bottom: 0.51 μm, average diameter D2 at the particle middle: 0.73 μm, average diameter D3 at the particle end: 0.65 μm, ratio D2/D1 of the average diameter at the middle position to that at the bottom position: 1.23, ratio D3/D1 of the average diameter at the end position to that at the bottom position: 1.10, and ratio D3/D2 of the average diameter at the end position to that at the middle position: 0.89. These results all satisfied the preferred requirements of the present invention.

It should be readily understood that these are not fundamental requirements, i.e., not indispensable requirements of the present invention and that these are preferred requirements.

Subsequently, the copper foil was laminated to a resin MBT-830, and the copper layer was removed by etching.

It was observed that the sum of areas of holes accounting for the resin surface having the unevenness transferred from the roughened surface of the copper foil was 43% and that the density of the holes was 1.77 holes/μm². Thus, the requirement of the present invention that the sum of areas of holes accounts for 20% or more was satisfied.

The copper foil was laminated to the resin as described above, and peel strengths of the laminate in a normal state and after heating were measured. The results are also shown in Table 1. The circuit width for the peel strength was 10 mm. The peel strength in a normal state was 0.84 kg/cm, and the peel strength after heating was 0.77 kg/cm. Both peel strengths were higher than those in Comparative Examples described below.

Example 4

The rough surface (mat surface: M surface) of a copper foil with a carrier (thickness of ultra-thin copper layer: 3 μm, roughness Rz of roughness-forming surface of ultra-thin copper layer: 0.6 μm) treated as described above was subjected to roughening plating as follows and to normal plating as in Example 1. The treatment conditions for the roughening plating are shown below. These are all steps for forming the roughened layer of the copper foil of the present invention. The ratio of current density to limiting current density during roughening particle formation was adjusted to 3.50.
 (Liquid Composition 1)
 Cu: 15 g/L
 $H_2SO_4$: 100 g/L
 W: 3 mg/L
 Sodium dodecyl sulfate amount: 10 ppm
 (Electroplating Temperature 1): 50° C.

In this roughened layer, the surface roughness Rz was 1.62 μm, the average diameter D1 at the particle bottom being apart from the bottom of each particle by 10% of the particle length was 0.89 μm, the particle length L1 was 2.98 μm, and the ratio L1/D1 of the particle length L1 to the average diameter D1 at the particle bottom was 3.33. It was presumed from FIG. 2 that the roughened layer was formed in an acicular or rod-like particle shape. The diameters of the roughening particles were measured in accordance with JIS H 0501, Section 7, Cutting method.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

Table 1 also shows other data of the roughening particles, i.e., average diameter (width) D1 at the particle bottom: 0.89 μm, average diameter D2 at the particle middle: 1.65 μm, average diameter D3 at the particle end: 0.98 μm, ratio D2/D1 of the average diameter at the middle position to that at the bottom position: 1.18, ratio D3/D1 of the average diameter at the end position to that at the bottom position: 1.10, and ratio D3/D2 of the average diameter at the end position to that at the middle position: 0.93. These results all satisfied the preferred requirements of the present invention.

It should be readily understood that these are not fundamental requirements, i.e., not indispensable requirements of the present invention and that these are preferred requirements.

Subsequently, the copper foil was laminated to a resin GHPL-830MBT, and the copper layer was removed by etching.

It was observed that the sum of areas of holes accounting for the resin surface having the unevenness transferred from the roughened surface of the copper foil was 78% and that the density of the holes was 2.02 holes/μm². Thus, the requirement of the present invention that the sum of areas of holes accounts for 20% or more was satisfied.

The copper foil was laminated to the resin as described above, and peel strengths of the laminate in a normal state and after heating were measured. The results are also shown in Table 1. The circuit width for the peel strength was 10 mm. The peel strength in a normal state was 0.90 kg/cm, and the peel strength after heating was 0.86 kg/cm. Both peel strengths were higher than those in Comparative Examples described below.

Example 5

The rough surface (mat surface: M surface) of the copper foil with a carrier (thickness of ultra-thin copper layer: 2 μm, roughness Rz of roughness-forming surface of ultra-thin copper layer: 0.6 μm) treated as described above was subjected to roughening plating as follows and to normal plating as in Example 1. The treatment conditions for the roughening plating are shown below. These are all steps for forming the roughened layer of the copper foil of the present invention. The ratio of current density to limiting current density during roughening particle formation was adjusted to 4.80.

(Liquid Composition 1)
Cu: 15 g/L
$H_2SO_4$: 100 g/L
W: 3 mg/L
Sodium dodecyl sulfate amount: 10 ppm
(Electroplating Temperature 1): 50° C.

In this roughened layer, the surface roughness Rz was 1.01 μm, the average diameter D1 at the particle bottom being apart from the bottom of each particle by 10% of the particle length was 0.26 μm, the particle length L1 was 2.68 μm, and the ratio L1/D1 of the particle length L1 to the average diameter D1 at the particle bottom was 10.34. It was presumed from FIG. 2 that the roughened layer was formed in an acicular or rod-like particle shape. The diameters of the roughening particles were measured in accordance with JIS H 0501, Section 7, Cutting method.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

Table 1 also shows other data of the roughening particles, i.e., average diameter (width) D1 at the particle bottom: 0.26 μm, average diameter D2 at the particle middle: 0.84 μm, average diameter D3 at the particle end: 0.79 μm, ratio D2/D1 of the average diameter at the middle position to that at the bottom position: 3.23, ratio D3/D1 of the average diameter at the end position to that at the bottom position: 3.06, and ratio D3/D2 of the average diameter at the end position to that at the middle position: 0.95. These results all satisfied the preferred requirements of the present invention.

It should be readily understood that these are not fundamental requirements, i.e., not indispensable requirements of the present invention and that these are preferred requirements.

Subsequently, the copper foil was laminated to a resin GHPL-830MBT and the copper layer was removed by etching.

It was observed that the sum of areas of holes accounting for the resin surface having the unevenness transferred from the roughened surface of the copper foil was 40% and that the density of the holes was 2.65 holes/μm$^2$. Thus, the requirement of the present invention that the sum of areas of holes accounts for 20% or more was satisfied.

The copper foil was laminated to the resin as described above, and peel strengths of the laminate in a normal state and after heating were measured. The results are also shown in Table 1. The circuit width for the peel strength was 10 mm. The peel strength in a normal state was 0.91 kg/cm, and the peel strength after heating was 0.84 kg/cm. Both peel strengths were higher than those in Comparative Examples described below.

Example 6

The rough surface (mat surface: M surface) of the copper foil with a carrier (thickness of ultra-thin copper layer: 12 μm, roughness Rz of roughness-forming surface of ultra-thin copper layer: 0.6 μm) treated as described above was subjected to roughening plating as follows and to normal plating as in Example 1. The treatment conditions for the roughening plating are shown below. These are all steps for forming the roughened layer of the copper foil of the present invention. The ratio of current density to limiting current density during roughening particle formation was adjusted to 3.20.

(Liquid Composition 1)
Cu: 15 g/L
$H_2SO_4$: 100 g/L
W: 3 mg/L
Sodium dodecyl sulfate amount: 10 ppm
(Electroplating Temperature 1): 50° C.

In this roughened layer, the surface roughness Rz was 1.48 μm, the average diameter D1 at the particle bottom being apart from the bottom of each particle by 10% of the particle length was 0.60 μm, the particle length L1 was 2.68 μm, and the ratio L1/D1 of the particle length L1 to the average diameter D1 at the particle bottom was 4.44. It was presumed from FIG. 2 that the roughened layer was formed in an acicular or rod-like particle shape. The diameters of the roughening particles were measured in accordance with JIS H 0501, Section 7, Cutting method.

The roughened layer of the copper foil satisfied the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. These requirements are indispensable for achieving the present invention. The results are shown in Table 1.

Table 1 also shows other data of the roughening particles, i.e., average diameter (width) D1 at the particle bottom: 0.60 μm, average diameter D2 at the particle middle: 0.84 μm, average diameter D3 at the particle end: 0.78 μm, ratio D2/D1 of the average diameter at the middle position to that at the bottom position: 1.39, ratio D3/D1 of the average diameter at the end position to that at the bottom position: 1.30, and ratio D3/D2 of the average diameter at the end position to that at the middle position: 0.94. These results all satisfied the preferred requirements of the present invention.

It should be readily understood that these are not fundamental requirements, i.e., not indispensable requirements of the present invention and that these are preferred requirements.

Subsequently, the copper foil was laminated to a resin GHPL-830MBT, and the copper layer was removed by etching.

It was observed that the sum of areas of holes accounting for the resin surface having the unevenness transferred from the roughened surface of the copper foil was 93% and that the density of the holes was 2.22 holes/μm2. Thus, the requirement of the present invention that the sum of areas of holes accounts for 20% or more was satisfied.

The copper foil was laminated to the resin as described above, and peel strengths of the laminate in a normal state and after heating were measured. The results are also shown in Table 1. The circuit width for the peel strength was 10 mm. The peel strength in a normal state was 0.91 kg/cm, and the peel strength after heating was 0.91 kg/cm. Both peel strengths were higher than those in Comparative Examples described below.

Comparative Example 1

The rough surface (mat surface: M surface) of copper foil with a carrier (thickness of ultra-thin copper layer: 5 μm, roughness Rz of roughness-forming surface of ultra-thin copper layer: 0.6 μm) treated as described above was subjected to roughening plating as follows and to normal plating as in Example 1. The treatment conditions for the roughening plating are shown below. The ratio of current density to limiting current density during roughening particle formation was adjusted to 10.50.

(Liquid Composition 1)
Cu: 15 g/L
$H_2SO_4$: 100 g/L
W: 3 mg/L
Sodium dodecyl sulfate amount: 10 ppm
(Electroplating Temperature 1): 50° C.

Figure 3:
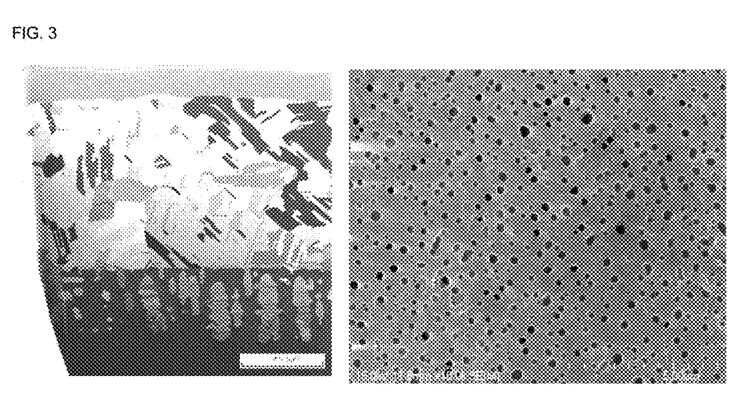
FIG. 3 shows an FIB-SIM photograph of the roughened layer of Comparative Example 1 and an SEM photograph (the right) of a resin (replica) surface prepared by laminating a resin to a copper layer and then removing the copper layer by etching.

An SEM photograph of the roughened layer of Comparative Example 1 is shown in the left of FIG. 3. In this roughened layer, the surface roughness Rz was 1.13 μm, the average diameter D1 at the particle bottom being apart from the bottom of each particle by 10% of the particle length was 0.12 μm giving a small bottom width, the particle length L1 was 3.87 μm, and the ratio L1/D1 of the particle length L1 to the average diameter D1 at the particle bottom was 30.97. It was presumed from FIG. 3 that the roughened layer was formed in an acicular or dendrite-like particle shape that did not satisfy the requirements of the present invention. The diameters of the roughening particles were measured in accordance with JIS H 0501, Section 7, Cutting method.

As described above, the roughened layer of the copper foil did not satisfy the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. The results are shown in Table 1.

Table 1 also shows other data of the roughening particles, i.e., average diameter (width) D1 at the particle bottom: 0.12 μm, average diameter D2 at the particle middle: 0.74 μm, average diameter D3 at the particle end: 0.74 μm, ratio D2/D1 of the average diameter at the middle position to that at the bottom position: 5.93, ratio D3/D1 of the average diameter at the end position to that at the bottom position: 5.93, and ratio D3/D2 of the average diameter at the end position to that at the middle position: 1.00. These results all did not satisfy the preferred requirements of the present invention.

Subsequently, the copper foil was laminated to a resin GHPL-830MBT. The copper layer was removed by etching. An SEM photograph of the surface of the resin (replica) after the removal of the copper layer by etching is shown in the right of FIG. 3. It was observed that the sum of areas of holes accounting for the resin surface having the unevenness transferred from the roughened surface of the copper foil was 2% and that the density of the holes was 1.06 holes/μm2. Thus, the requirement of the present invention that the sum of areas of holes accounts for 20% or more was not satisfied.

The copper foil was laminated to the resin GHPL-830MBT as described above, and peel strengths of the laminate in a normal state and after heating were measured. The results are also shown in Table 1. The circuit width for the peel strength was 10 mm. The peel strength in a normal state was 0.54 kg/cm, and the peel strength after heating was 0.53 kg/cm. Both peel strengths were considerably low compared to those in Examples described above. In the copper foil including roughening particles having a thin bottom portion as described above, an improvement in peel strength could not be expected because of the occurrence of peeling at the interface between the copper layer and the roughening particles when separating the copper foil and the resin.

Comparative Example 2

The rough surface (mat surface: M surface) of a copper foil with a carrier (thickness of ultra-thin copper layer: 5 μm, roughness Rz of roughness-forming surface of ultra-thin copper layer: 0.6 μm) treated as described above was subjected to roughening plating as follows and to normal plating as in Example 1. The treatment conditions for the roughening plating are shown below. The ratio of current density to limiting current density during roughening particle formation was adjusted to 9.50.

(Liquid Composition 1)
Cu: 15 g/L
$H_2SO_4$: 100 g/L
W: 3 mg/L
Sodium dodecyl sulfate amount: 10 ppm
(Electroplating Temperature 1): 50° C.

In the roughened layer of Comparative Example 2, the surface roughness Rz was 1.02 μm, the average diameter D1 at the particle bottom being apart from the bottom of each particle by 10% of the particle length was 0.15 μm giving a small bottom width, the particle length L1 was 2.83 μm, and the ratio L1/D1 of the particle length L1 to the average diameter D1 at the particle bottom was 18.54. It was presumed from FIG. 3 that the roughened layer was formed in an acicular or dendrite-like particle shape that did not satisfy the requirements of the present invention. The diameters of the roughening particles were measured in accordance with JIS H 0501, Section 7, Cutting method.

As described above, the roughened layer of the copper foil did not satisfy the requirements of the present invention that the average diameter D1 at the particle bottom being apart from the bottom of each particle by 10% of the particle length is 0.2 to 1.0 μm and that the ratio L1/D1 of the particle length L1 to the average diameter D1 at the particle bottom is 15 or less. The results are shown in Table 1.

Table 1 also shows other data of the roughening particles, i.e., average diameter (width) D1 at the particle bottom: 0.15 μm, average diameter D2 at the particle middle: 0.65 μm, average diameter D3 at the particle end: 0.65 μm, ratio D2/D1 of the average diameter at the middle position to that at the bottom position: 4.25, ratio D3/D1 of the average diameter at the end position to that at the bottom position: 4.25, and ratio D3/D2 of the average diameter at the end position to that at the middle position: 1.00. These results all did not satisfy the preferred requirements of the present invention.

Subsequently, the copper foil was laminated to a resin GHPL-830MBT. The copper layer was removed by etching.

It was observed that the sum of areas of holes accounting for the resin surface having the unevenness transferred from the roughened surface of the copper foil was 4% and that the density of the holes was 2.11 holes/µm2. Thus, the requirement of the present invention that the sum of areas of holes accounts for 20% or more was not satisfied.

The copper foil was laminated to the resin GHPL-830MBT as described above, and peel strengths of the laminate in a normal state and after heating were measured. The results are also shown in Table 1. The circuit width for the peel strength was 10 mm. The peel strength in a normal state was 0.54 kg/cm, and the peel strength after heating was 0.53 kg/cm. Both peel strengths were considerably low compared to those in Examples described above.

In the copper foil including roughening particles having a thin bottom portion as described above, an improvement in peel strength could not be expected because of the occurrence of peeling at the interface between the copper layer and the roughening particles when separating the copper foil and the resin.

Comparative Example 3

The rough surface (mat surface: M surface) of a copper foil with a carrier (thickness of ultra-thin copper layer: 5 µm, roughness Rz of roughness-forming surface of ultra-thin copper layer: 0.6 µm) treated as described above was subjected to roughening plating as follows and to normal plating as in Example 1. The treatment conditions for the roughening plating are shown below. The ratio of current density to limiting current density during roughening particle formation was adjusted to 9.80.

(Liquid Composition 1)
Cu: 15 g/L
$H_2SO_4$: 100 g/L
W: 3 mg/L
sodium dodecyl sulfate amount: 10 ppm
(Electroplating Temperature 1): 50° C.

In the roughened layer of Comparative Example 3, the surface roughness Rz was 0.88 µm, the average diameter D1 at the particle bottom being apart from the bottom of each particle by 10% of the particle length was 0.14 µm giving a small bottom width, the particle length L1 was 2.98 µm, and the ratio L1/D1 of the particle length L1 to the average diameter D1 at the particle bottom was 20.64. It was presumed from FIG. 3 that the roughened layer was formed in an acicular or dendrite-like particle shape that did not satisfy the requirements of the present invention. The diameters of the roughening particles were measured in accordance with JIS H 0501, Section 7, Cutting method.

As described above, the roughened layer of the copper foil did not satisfy the requirements of the present invention that the average diameter D1 at the particle bottom being apart from the bottom of each particle by 10% of the particle length is 0.2 to 1.0 µm and that the ratio L1/D1 of the particle length L1 to the average diameter D1 at the particle bottom is 15 or less. The results are shown in Table 1.

Table 1 also shows other data of the roughening particles, i.e., average diameter (width) D1 at the particle bottom: 0.14 µm, average diameter D2 at the particle middle: 0.65 µm, average diameter D3 at the particle end: 0.65 µm, ratio D2/D1 of the average diameter at the middle position to that at the bottom position: 4.50, ratio D3/D1 of the average diameter at the end position to that at the bottom position: 4.50, and ratio D3/D2 of the average diameter at the end position to that at the middle position: 1.00. These results all did not satisfy the preferred requirements of the present invention.

Subsequently, the copper foil was laminated to a resin GHPL-830MBT. The copper layer was removed by etching.

It was observed that the sum of areas of holes accounting for the resin surface having the unevenness transferred from the roughened surface of the copper foil was 14% and that the density of the holes was 3.12 holes/µm2. Thus, the requirement of the present invention that the sum of areas of holes accounts for 20% or more was not satisfied.

The copper foil was laminated to the resin GHPL-830MBT as described above, and peel strengths of the laminate in a normal state and after heating were measured. The results are also shown in Table 1. The circuit width for the peel strength was 10 mm. The peel strength in a normal state was 0.54 kg/cm, and the peel strength after heating was 0.53 kg/cm. Both peel strengths were considerably low compared to those in Examples described above. In the copper foil including roughening particles having a thin bottom portion as described above, an improvement in peel strength could not be expected because of the occurrence of peeling at the interface between the copper layer and the roughening particles when separating the copper foil and the resin.

As described above, the copper foil for printed wiring boards of the present invention includes acicular fine roughening particles on at least one surface of the copper foil instead of the roundish or spherical projections or dendrite-like crystal grains that have been conventionally believed to be good for roughening treatment. As a result, the adhesion strength between the copper foil itself and a resin is increased, and it is thereby possible to provide high peel strength to a substrate for package in chemical treatment during fine-pattern formation. It is understood that the present invention has a notable effect of providing a copper foil that allows fine etching and a method of producing the copper foil.

Example 21

A copper layer was formed under the same conditions as those in Example 1 except that a CoMo alloy intermediate layer was formed between the carrier and the copper foil. In this case, the CoMo alloy intermediate layer was produced by plating in a plating solution having the following liquid composition.

(Liquid Composition)
$CoSO_4 \cdot 7H_2O$: 0.5 to 100 g/L
$Na_2MoO_4 \cdot 2H_2O$: 0.5 to 100 g/L
Sodium citrate dihydrate: 20 to 300 g/L
(Temperature): 10 to 70° C.
(pH): 3 to 5
(Current density): 0.1 to 60 A/dm$^2$ The copper foil was laminated to the resin (GHPL-830MBT) as described above, and peel strengths of the laminate in a normal state and after heating were measured. The results are shown in Table 2. The circuit width for the peel strength was 10 mm.

The peel strength in a normal state was 1.01 kg/cm, and the peel strength after heating was 0.94 kg/cm. Both peel strengths were higher than those in Comparative Examples as described.

TABLE 2

| | Intermediate layer | Ratio of current density to limiting current density during roughening particle formation | Peel strength | | Roughness (μm) | Roughening particles | | | | | | | Replica | | |
|---|---|---|---|---|---|---|---|---|---|---|---|---|---|---|---|
| | | | Normal state (kg/cm) | After heating | | Bottom width D1 | Middle D2 | End D3 | D2/D1 | D3/D1 | D3/D2 | Length | Ratio (length/width) | Density (particles/μm²) | Area ratio (%) |
| Example 21 | CoMo alloy | 2.50 | 1.01 | 0.94 | 1.17 | 0.57 | 0.83 | 0.68 | 1.47 | 1.21 | 0.83 | 2.68 | 4.74 | 2.10 | 51% |
| Example 22 | Cr | 3.10 | 0.81 | 0.78 | 1.51 | 0.51 | 0.78 | 0.68 | 1.51 | 1.32 | 0.87 | 2.68 | 5.21 | 1.93 | 29% |
| Example 23 | Cr/CuP | 4.30 | 0.84 | 0.77 | 1.56 | 0.59 | 0.73 | 0.65 | 1.23 | 1.10 | 0.89 | 2.68 | 4.52 | 1.77 | 43% |
| Example 24 | Ni/Cr | 3.50 | 0.90 | 0.86 | 1.62 | 0.89 | 1.05 | 0.98 | 1.18 | 1.10 | 0.93 | 2.98 | 3.33 | 2.02 | 78% |
| Example 25 | Co/chromate | 4.80 | 0.91 | 0.84 | 1.01 | 0.26 | 0.84 | 0.79 | 3.23 | 3.06 | 0.95 | 2.68 | 10.34 | 2.65 | 40% |
| Example 26 | Organic compound | 3.20 | 0.91 | 0.91 | 1.48 | 0.60 | 0.84 | 0.78 | 1.39 | 1.30 | 0.94 | 2.68 | 4.44 | 2.22 | 93% |

Resin: MBT-830
Peel strength measurement circuit width: 10 mm
Roughening particle bottom width measurement process: JIS H 0501 Section 7 Cutting method

Example 22

A copper layer was formed under the same conditions as those in Example 2 except that a Cr intermediate layer was formed between the carrier and the copper foil. In this case, the Cr intermediate layer was produced by plating in a plating solution having the following liquid composition.
(Liquid Composition)
$CrO_3$: 200 to 400 g/L
$H_2SO_4$: 1.5 to 4 g/L
(pH): 1 to 4
(Liquid temperature): 45 to 60° C.
(Current density): 10 to 40 A/dm²

The copper foil was laminated to the resin (MBT-830) as described above, and peel strengths of the laminate in a normal state and after heating were measured. The results are shown in Table 2.

The circuit width for the peel strength was 10 mm. The peel strength in a normal state was 0.81 kg/cm, and the peel strength after heating was 0.78 kg/cm. Both peel strengths were higher than those in Comparative Examples as described.

Example 23

A copper layer was formed under the same conditions as those in Example 3 except that a Cr/CuP intermediate layer was formed between the carrier and the copper foil. In this case, the Cr/CuP intermediate layer was produced by plating in a plating solution having the following liquid composition.
(Liquid Composition 1)
$CrO_3$: 200 to 400 g/L
$H_2SO_4$: 1.5 to 4 g/L
(pH): 1 to 4
(Liquid temperature): 45 to 60° C.
(Current density): 10 to 40 A/dm²
(Liquid Composition 2)
$Cu_2P_2O_7 \cdot 3H_2O$: 5 to 50 g/L
$K_4P_2O_7$: 50 to 300 g/L
(Temperature): 30 to 60° C.
(pH): 8 to 10
(Current density): 0.1 to 1.0 A/dm²

The copper foil was laminated to the resin (MBT-830) as described above, and peel strengths of the laminate in a normal state and after heating were measured. The results are shown in Table 2.

The circuit width for the peel strength was 10 mm. The peel strength in a normal state was 0.84 kg/cm, and the peel strength after heating was 0.77 kg/cm. Both peel strengths were higher than those in Comparative Examples as described.

Example 24

A copper layer was formed under the same conditions as those in Example 4 except that a Ni/Cr intermediate layer was formed between the carrier and the copper foil. In this case, the Ni/Cr intermediate layer was produced by plating in a plating solution having the following liquid composition.
(Liquid Composition 1)
$NiSO_4 \cdot 6H_2O$: 250 to 300 g/L
$NiCl_2 \cdot 6H_2O$: 35 to 45 g/L
Boric acid: 10 to 50 g/L
(pH): 2 to 6
(Bath temperature): 30 to 70° C.
(Current density): 0.1 to 50 A/dm²
(Liquid Composition 2)
$CrO_3$: 200 to 400 g/L
$H_2SO_4$: 1.5 to 4 g/L
(pH): 1 to 4
(Liquid temperature): 45 to 60° C.
(Current density): 10 to 40 A/dm²

The copper foil was laminated to the resin (MBT-830) as described above, and peel strengths of the laminate in a normal state and after heating were measured. The results are shown in Table 2.

The circuit width for the peel strength was 10 mm. The peel strength in a normal state was 0.90 kg/cm, and the peel strength after heating was 0.86 kg/cm. Both peel strengths were higher than those in Comparative Examples as described.

Example 25

A copper layer was formed under the same conditions as those in Example 4 except that a Co/chromate treated intermediate layer was formed between the carrier and the copper foil.

In this case, the Co/chromate treated intermediate layer was produced by plating in a plating solution having the following liquid composition.

(Liquid Composition 1)
$CoSO_4.7H_2O$: 10 to 100 g/L
Sodium citrate dihydrate: 30 to 200 g/L
(Temperature): 10 to 70° C.
(pH): 3 to 5
(Current density): 0.1 to 60 A/dm$^2$
(Liquid Composition 2)
$CrO_3$: 1 to 10 g/L
(Temperature): 10 to 70° C.
(pH): 10 to 12
(Current density): 0.1 to 1.0 A/dm$^2$ The copper foil was laminated to the resin (MBT-830) as described above, and peel strengths of the laminate in a normal state and after heating were measured. The results are shown in Table 2.

The circuit width for the peel strength was 10 mm. The peel strength in a normal state was 0.91 kg/cm, and the peel strength after heating was 0.84 kg/cm. Both peel strengths were higher than those in Comparative Examples as described.

Example 26

A copper layer was formed under the same conditions as those in Example 4 except that an organic compound intermediate layer was formed between the carrier and the copper foil.

In this case, the organic compound intermediate layer was produced by spraying an aqueous 1 to 10 g/L carboxybenzotriazole solution at a liquid temperature of 40° C. and a pH of 5 for 10 to 60 seconds.

The copper foil was laminated to the resin (MBT-830) as described above, and peel strengths of the laminate in a normal state and after heating were measured. The results are shown in Table 2.

The circuit width for the peel strength was 10 mm. The peel strength in a normal state was 0.91 kg/cm, and the peel strength after heating was 0.91 kg/cm. Both peel strengths were higher than those in Comparative Examples as described.

INDUSTRIAL APPLICABILITY

As described above, the present invention has a notable effect of providing a copper foil with a carrier including acicular fine roughening particles on at least one surface of the copper foil with a carrier and thereby enhancing the adhesion strength of the copper foil itself with resin so as to provide high peel strength to a substrate for package also in chemical treatment during fine-pattern formation and to allow fine etching and providing a method of producing the copper foil with corrier.

In recent increases in fineness of printed circuit patterns and in frequency, the copper foil with a carrier for a printed circuit board of the present invention is significantly effective as a copper foil for printed circuits (copper foil for a semiconductor package substrate) or a substrate for semiconductor package composed of a copper foil for a semiconductor package substrate and a resin for semiconductor package bonded to each other.

The invention claimed is:

1. A copper foil with a carrier comprising a carrier, an intermediate layer, and an ultra-thin copper layer laminated in this order, the ultra-thin copper layer having a thickness smaller than a thickness of the carrier, wherein the copper foil with a carrier comprises a roughened layer on a surface of the ultra-thin copper layer; and when a resin layer is laminated to the roughened layer of the copper foil with a carrier, then the carrier and the intermediate layer are peeled from the ultra-thin copper layer, and then the ultra-thin copper layer is removed by etching, the sum of areas of holes on a roughened surface of the resin layer having unevenness transferred from a surface of the roughened layer accounts for 20% or more of the roughened surface of the resin layer.

* * * * *